(12) United States Patent
Chang

(10) Patent No.: US 9,632,133 B2
(45) Date of Patent: Apr. 25, 2017

(54) CIRCUIT BOARD TESTING SYSTEM

(71) Applicant: Primax Electronics Ltd., Neihu, Taipei (TW)

(72) Inventor: Pei-Ming Chang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 379 days.

(21) Appl. No.: 14/192,308

(22) Filed: Feb. 27, 2014

(65) Prior Publication Data

US 2015/0168485 A1 Jun. 18, 2015

(30) Foreign Application Priority Data

Dec. 17, 2013 (TW) .............................. 102146613 A (51) Int. Cl.
*G01R 31/28* (2006.01)
*G01R 1/073* (2006.01)
*G01R 3/00* (2006.01)

(52) U.S. Cl.
CPC ...... *G01R 31/2815* (2013.01); *G01R 1/07378* (2013.01); *G01R 3/00* (2013.01); *G01R 31/2803* (2013.01); *G01R 31/2806* (2013.01); *G01R 31/2889* (2013.01)

(58) Field of Classification Search
CPC ............ G01R 31/2815; G01R 31/2803; G01R 31/2806; G01R 3/00; G01R 31/2889; G01R 1/07378
USPC ..................................................... 324/754.03
See application file for complete search history.

(56) References Cited

U.S. PATENT DOCUMENTS

| 5,818,247 A * | 10/1998 | Pyun .................. | G01R 31/2806 324/750.18 |
|---|---|---|---|
| 5,969,530 A * | 10/1999 | Yamashita ......... | G01R 31/2805 324/523 |
| 6,054,863 A * | 4/2000 | Morrison ........... | G01R 31/2803 324/537 |
| 6,339,236 B1 * | 1/2002 | Tomii .................. | H03K 17/785 257/223 |
| 6,714,033 B1 * | 3/2004 | Makhratchev ..... | G01R 19/0061 324/750.26 |
| 7,005,876 B2 * | 2/2006 | Wei ....................... | B81C 99/005 324/750.23 |
| 7,049,809 B2 * | 5/2006 | Luo ........................ | G11B 5/102 324/210 |
| 7,253,650 B2 * | 8/2007 | Balchiunas ........ | G01R 31/2831 324/73.1 |

(Continued)

*Primary Examiner* — Patrick Assouad
*Assistant Examiner* — Christopher McAndrew
(74) *Attorney, Agent, or Firm* — Kirton McConkie; Evan R. Witt (57) ABSTRACT

A circuit board testing system includes a testing fixture and a computer system. The testing fixture includes a contact element, a switching circuit, and a data acquisition unit. The contact element is connected with a circuit board. The switching circuit is connected with the contact element. By enabling the switching circuit, the data acquisition unit acquires a real voltage value corresponding to the electronic component. The computer system is connected with the testing fixture for converting the real voltage value into a real resistance value corresponding to the electronic component. According to the real resistance value, the computer system judges whether the electronic component passes the test.

3 Claims, 6 Drawing Sheets

(56) References Cited

U.S. PATENT DOCUMENTS

| | | | | |
|---|---|---|---|---|
| 7,492,179 B2* | 2/2009 | Chiu | G01R 31/31718 | 324/754.03 |
| 7,528,507 B2* | 5/2009 | Carson | H02H 3/12 | 307/116 |
| 7,591,657 B2* | 9/2009 | Teicher | H01R 27/00 | 439/173 |
| 7,633,309 B2* | 12/2009 | Kumagai | G01R 31/2886 | 324/754.03 |
| 7,725,238 B2* | 5/2010 | Perkins | B60T 1/10 | 123/563 |
| 7,859,277 B2* | 12/2010 | Mayder | G01R 31/2889 | 324/754.03 |
| 7,924,035 B2* | 4/2011 | Huebner | G01R 31/31926 | 324/754.01 |
| 7,932,739 B2* | 4/2011 | Liang | G01R 1/0483 | 257/48 |
| 8,097,985 B2* | 1/2012 | Carson | H02H 3/12 | 307/116 |
| 8,159,245 B2* | 4/2012 | Komatsu | G01R 1/0408 | 324/754.01 |
| 8,177,443 B2* | 5/2012 | Malone | B26D 5/00 | 400/134 |
| 8,269,514 B2* | 9/2012 | Hobbs | G01R 1/06761 | 324/754.03 |
| 8,269,515 B2* | 9/2012 | Mayder | G01R 31/31924 | 324/750.3 |
| 8,305,101 B2* | 11/2012 | Desta | G01R 1/07378 | 324/754.03 |
| 8,310,256 B2* | 11/2012 | Suto | G01R 31/312 | 324/690 |
| 2008/0150562 A1* | 6/2008 | Kumagai | G01R 31/2886 | 324/754.03 |

* cited by examiner

CIRCUIT BOARD TESTING SYSTEM

FIELD OF THE INVENTION

The present invention relates to a testing system, and more particularly to a circuit board testing system.

BACKGROUND OF THE INVENTION

With increasing development of science and technology, electronic devices become more and more popular to personal users. The widely-used electronic device includes for example a computer host, a notebook computer, a mobile phone or any other appropriate portable electronic device. Moreover, a peripheral input device may be cooperatively used with the electronic device in order to enhance the operating flexibility of the electronic device. The peripheral input device includes for example a mouse device, a keyboard device or a trackball device.

As known, not only the electronic device but also the peripheral input device has a circuit board therein. Through the circuits and electronic components on the circuit board, the electronic device or the peripheral input device can be normally operated. Generally, in the fabrication of the electronic device or the peripheral input device, a testing method should be performed to realize whether the functions of the electronic device or the peripheral input device are normal or not. The testing method comprises a procedure of testing the circuit board before the electronic device or the peripheral input device is assembled and a procedure of testing the overall functions of the assembled electronic device or the assembled peripheral input device. By testing the circuit board, the manufacturer may realize whether any defects are present in the circuit board before the electronic device or the peripheral input device is assembled. If the procedure of testing the circuit board is not done and some defects are found after the electronic device or the peripheral input device is assembled, the manufacturer needs to disassemble the electronic device or the peripheral input device to debug the circuit board. It is time-consuming to disassemble the electronic device or the peripheral input device and debug the circuit board.

Generally, the method of testing the circuit board includes a static testing procedure and a dynamic testing procedure. The static testing procedure is a power-off testing procedure. In the power-off testing procedure, the electronic components on the circuit board are tested by interrupting the power to the circuit board. The electronic components are for example inductors, capacitors, resistors or any other electronic components with resistances. The dynamic testing procedure is a power-on testing procedure. In the power-on testing procedure, the functions of the electronic components on the circuit board are tested by providing the power to the circuit board.

In the static testing procedure of the circuit board, a contact probe of an electricity meter is used to sequentially measure the plural electronic components on the circuit board. In other words, the static testing procedure is both time-consuming and labor-intensive. After the circuit board is manually tested for a long time, the tester may feel tired. Consequently, the electronic components may be repeatedly measured, or the contact probe may fail to be accurately contacted with the electronic components to result in erroneous judgment. In other words, the conventional manual testing method is time-consuming, labor-intensive and prone to erroneous judgment. Recently, an LCR meter with a testing fixture is introduced into the market. The LCR meter is electronic test equipment for automatically measuring the equivalent resistance of the electronic components. However, since the LCR meter is expensive, the automatic testing method is not cost-effective. In addition, the number of electronic components to be simultaneously tested by the LCR meter is limited.

Therefore, there is a need of providing a cost-effective circuit board testing system without the manual measurement.

SUMMARY OF THE INVENTION

An object of the present invention provides a cost-effective circuit board testing system without the manual measurement.

In accordance with an aspect of the present invention, there is provided a circuit board testing system. The circuit board testing system includes a testing fixture and a computer system. The testing fixture is connected with a circuit board and acquires a real voltage value of an electronic component of the circuit board. The testing fixture includes a contact element, a switching circuit, and a data acquisition unit. The contact element is disposed on the testing fixture and contacted with the electronic component of the circuit board. The switching circuit is connected with the contact element. The data acquisition unit is electrically connected with the switching circuit and provides a test voltage and a start voltage to the switching circuit, thereby acquiring the real voltage value of the electronic component. The data acquisition unit includes a digital output pin for outputting the start voltage, an analog output pin for outputting the test voltage, and an analog input pin for acquiring the real voltage value of the electronic component. The computer system is electrically connected with the testing fixture and converting the real voltage value into a real resistance value corresponding to the electronic component.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

In this context, the electronic components on the circuit board include inductors, capacitors, resistors or any other electronic components with resistances. That is, the electronic components are not restricted to resistors.

Figure 1:
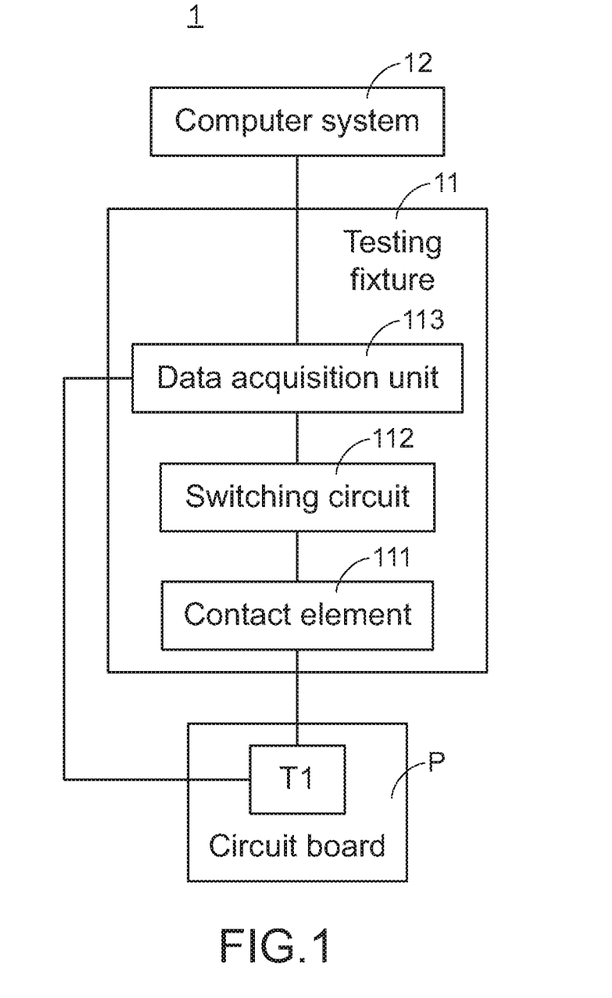
FIG. 1 is a schematic functional block diagram illustrating a circuit board testing system according to a first embodiment of the present invention.

For eliminating the drawbacks of the conventional technologies, the present invention provides a circuit board testing system. FIG. 1 is a schematic functional block diagram illustrating a circuit board testing system according to a first embodiment of the present invention. The circuit board testing system 1 may be applied to a static testing procedure of a circuit board. As shown in FIG. 1, the circuit board testing system 1 comprises a testing fixture 11 and a computer system 12. The testing fixture 11 is connected with a circuit board P to be tested. After the circuit board P is tested, a real voltage value of an electronic component T1 of the circuit board P is acquired by the testing fixture 11. The computer system 12 is electrically connected with the testing fixture 11. The computer system 12 may convert the real voltage value into a real resistance value corresponding to the electronic component T1. According to the real resistance value, the computer system 12 judges whether the electronic component T1 is qualified to pass the test. Moreover, the testing fixture 11 comprises a contact element 111, a switching circuit 112, and a data acquisition (DAQ) unit 113. The contact element 111 is disposed on the testing fixture 11, and corresponds to the electronic component T1. The contact element 111 is contacted with the electronic component T1 on the circuit board P. The switching circuit 112 is connected with the contact element 111. The data acquisition unit 113 is electrically connected with the switching circuit 112 for providing a test voltage Vt and a start voltage Vh to the switching circuit 112 in order to acquire the real voltage value of the electronic component T1. In this embodiment, the circuit board P is a printed circuit board (PCB), and the contact element 111 is a contact probe.

Figure 2:
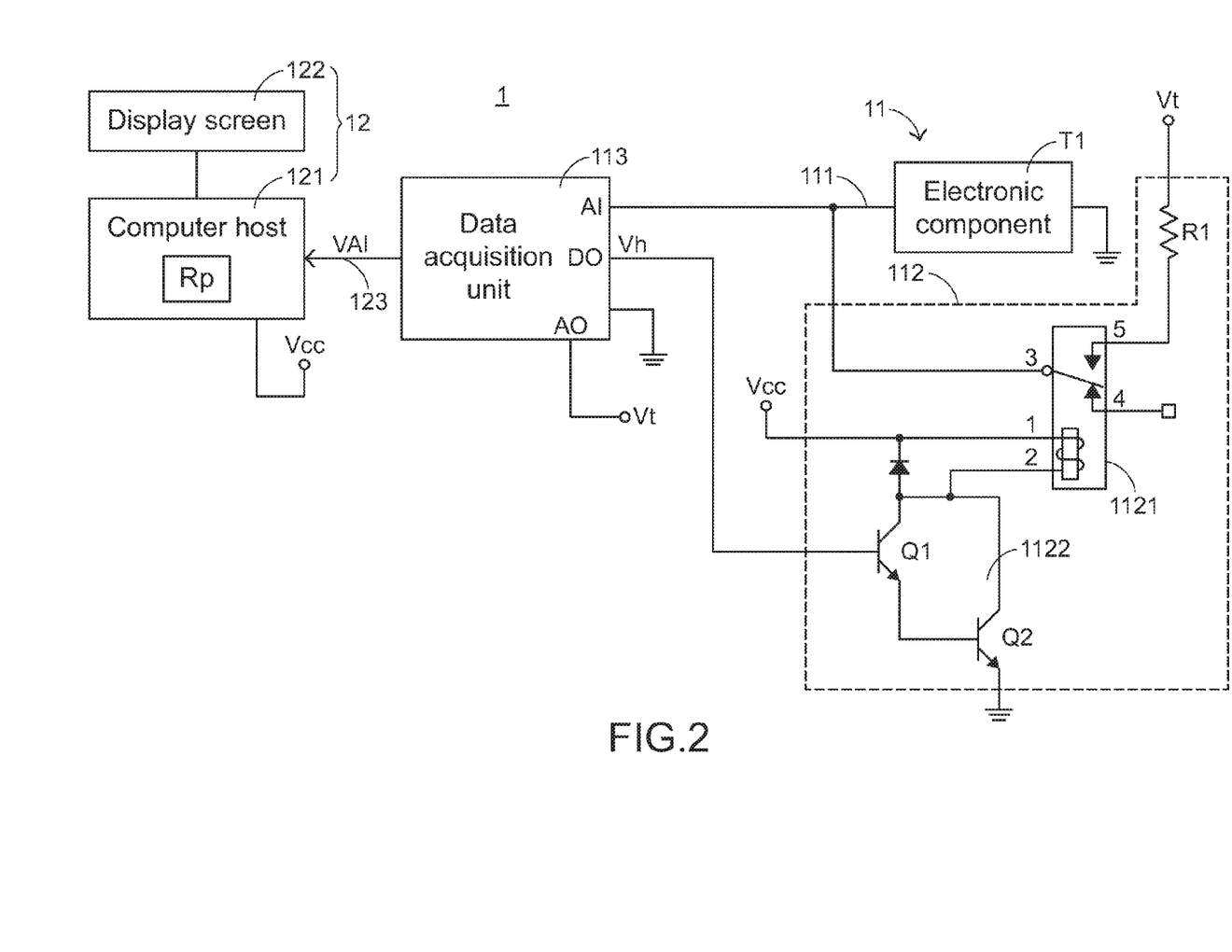
FIG. 2 is a schematic circuit diagram illustrating the circuit board testing system according to the first embodiment of the present invention.

Hereinafter, the circuitry configuration of the circuit board testing system of the present invention will be illustrated with reference to FIGS. 1 and 2. FIG. 2 is a schematic circuit diagram illustrating the circuit board testing system according to the first embodiment of the present invention. In this embodiment, only one electronic component T1 is mounted on the circuit board P. For clarification and succinctness, the electronic component T1, the computer system 12 and the data acquisition unit 113 shown in FIG. 2 are expressed as blocks. The switching circuit 112 comprises a fixed resistor R1, a single-pole-single-throw (SPST) relay 1121, and a driving circuit 1122. The fixed resistor R1 corresponds to the electronic component T1. The SPST relay 1121 comprises a common terminal (i.e. the contact 3 as shown in FIG. 2), a normally open terminal (i.e. the contact 4 as shown in FIG. 2), and a normally closed terminal (i.e. the contact 5 as shown in FIG. 2). The normally closed terminal is connected with the fixed resistor R1. The driving circuit 1122 is connected with the data acquisition unit 113 and the SPST relay 1121. In response to the operation of the data acquisition unit 113, the SPST relay 1121 is enabled by the driving circuit 1122. In this embodiment, the driving circuit 1122 is a Darlington circuit.

As shown in FIG. 2, the data acquisition unit 113 comprises a digital output pin DO, an analog output pin AO, and an analog input pin AI. The digital output pin DO is connected with the driving circuit 1122 for outputting the start voltage Vh to the driving circuit 1122. Consequently, the SPST relay 1121 is enabled by the driving circuit 1122 in response to the start voltage Vh. The analog output pin AO is connected with the fixed resistor R1 for outputting the test voltage Vt. The analog input pin AI is connected with the electronic component T1 and the common terminal of the SPST relay 1121 in order for acquiring the real voltage value of the electronic component T1. The computer system 12 comprises a computer host 121 and a display screen 122. The computer host 121 is connected with the data acquisition unit 113. A default resistance range Rp is previously stored in the computer host 121. According to the default resistance range Rp, the computer host 121 judges whether the circuit board P passes the test or not. The display screen 122 is connected with the computer host 121 for displaying the test result of the circuit board P. In this embodiment, the computer host 121 is connected with the data acquisition unit 113 through a USB interface 123.

Figure 3:
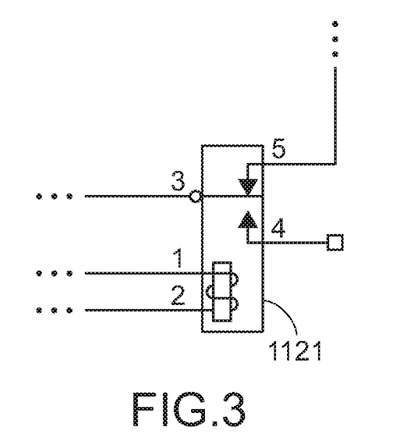
FIG. 3 is a schematic circuit diagram illustrating a close state of the single-pole-single-throw relay of the circuit board testing system according to the first embodiment of the present invention.
Figure 4:
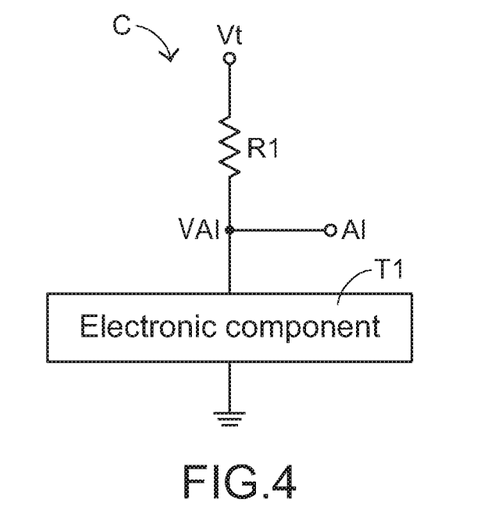
FIG. 4 is a schematic circuit diagram illustrating an equivalent circuit of the circuit board testing system according to the first embodiment of the present invention.

Before the electronic component T1 on the circuit board P is tested by the circuit board testing system 1 of the present invention, the circuit board P is placed on the testing fixture 11, and the contact element 111 of the testing fixture 11 is connected with the electronic component T1. The contact element 111 is capable of facilitating fixing the circuit board P on the testing fixture 11. In addition, the electrical connection between the electronic component T1 and the data acquisition unit 113 may be established through the contact element 111. After the circuit board P is properly placed on the testing fixture 11, the data acquisition unit 113 issues the start voltage Vh to the driving circuit 1122 through the digital output pin DO. In response to the start voltage Vh, two transistors (e.g. the transistors Q1 and Q2 as shown in FIG. 2) of the driving circuit 1122 are turned on. Consequently, the connection between the common terminal and the normally open terminal of the SPST relay 1121 is changed to the connection between the common terminal and the normally closed terminal of the SPST relay 1121. That is, the SPST relay 1121 is in a close state (see FIG. 3). On the other hand, the test voltage Vt is outputted from the data acquisition unit 113 through the analog output pin AO. Under this circumstance, the electronic component T1 and the fixed resistor R1 are collaboratively defined as an equivalent circuit C. The simplified configuration of the equivalent circuit C is shown in FIG. 4. In this embodiment, the start voltage Vh is a high logic level voltage (e.g. 5V).

As shown in FIG. 4, the analog input pin AI is connected with the equivalent circuit C. According to Ohm's law, the real voltage value VAI corresponding to the electronic component T1 is acquired from the equivalent circuit C by the analog input pin AI. Then, the real voltage value VAI is transmitted from the data acquisition unit 113 to the computer host 121 through the USB interface 123.

Please refer to FIG. 2 again. A formula for calculating a real resistance value corresponding to the electronic component T1 is previously stored in the computer host 121. The formula is expressed as: the real resistance value corresponding to the electronic component T1=(the real voltage value VAI×the resistance value of the fixed resistor R1)/(the test voltage Vt−the real voltage value VAI). The above formula is obtained according to the equivalent circuit C and Ohm's law. After the real voltage value VAI is received by the computer host 121, the real resistance value corresponding to the electronic component T1 is calculated by the computer host 121 according to the above formula. After the real resistance value is obtained, the computer host 121 judges whether the real resistance value is within the default resistance range Rp or not. If the real resistance value is within the default resistance range Rp, the computer host 121 determines that the electronic component T1 is qualified to pass the static test. Under this circumstance, a pass test message (not shown) is displayed on the display screen 122 to be viewed by the tester. Whereas, if the real resistance value is not within the default resistance range Rp, the computer host 121 determines that the static test of the electronic component T1 is unqualified. Under this circumstance, a failed test message (not shown) is displayed on the display screen 122. Consequently, according to the test result shown on the display screen 122, the tester may realize whether the electronic component T1 passes the static test.

From the above discussions, the above circuitry configuration of the circuit board testing system of the present invention is used to simulate the process of manually measuring the voltage value of the electronic component by the tester. Moreover, the resistance value of the electronic component is calculated according to the equivalent circuit and Ohm's law. Consequently, the circuit board testing system can judge whether the electronic component is successfully placed on the circuit board. Under this circumstance, the possibility of causing a short-circuited problem of the electronic component by poor soldering will be minimized. In this embodiment, only one electronic component T1 is mounted on the circuit board P. It is noted that the circuit board testing system of the present invention is not limited to test a circuit board with a single electronic component. Hereinafter, another circuit board testing system for testing a circuit board with plural electronic components will be illustrated.

Figure 5:
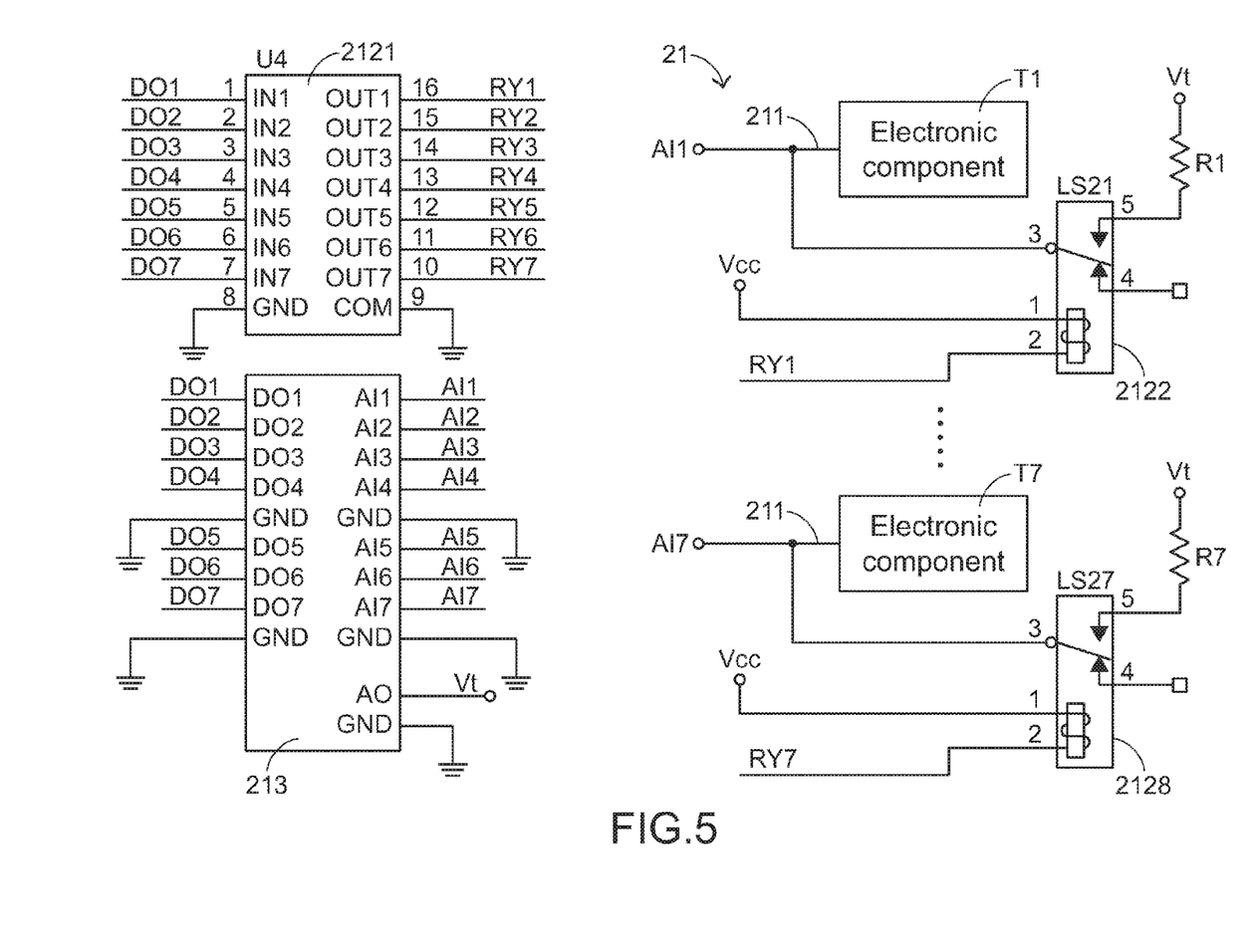
FIG. 5 is a schematic circuit diagram illustrating a circuit board testing system according to a second embodiment of the present invention.

The present invention further provides a second embodiment. FIG. 5 is a schematic circuit diagram illustrating a circuit board testing system according to a second embodiment of the present invention. The circuit board testing system 2 may be applied to a static testing procedure of a circuit board (not shown) with plural electronic components T1~T7. The circuit board testing system 2 comprises a testing fixture 21 and a computer system 12 (see FIG. 2). The computer system 12 comprises a computer host 121 and a display screen 122. The functions and operations of the computer system 12 of this embodiment are identical to those of the first embodiment, and are not redundantly described herein. In comparison with the first embodiment, the structure of the testing fixture 21 of this embodiment is distinguished. The components of the testing fixture 21 of this embodiment are substantially identical to those of the testing fixture 11 of the first embodiment, but the connecting relationships between these components are modified. The components of the testing fixture 21 will be illustrated in more details as follows.

As shown in FIG. 5, the testing fixture 21 comprises plural contact elements 211, a switching circuit 212, and a data acquisition unit 213. The plural contact elements 211 are disposed on the testing fixture 21, and correspond to the plural electronic components T1~T7. The plural contact elements 211 are respectively contacted with the plural electronic components T1~T7 on the circuit board. Each of the plural contact elements 211 corresponds to one electronic component. That is, the testing fixture 21 of this embodiment comprises 7 contact elements 211. The switching circuit 212 is connected with the plural contact elements 211. The switching circuit 212 comprises plural fixed resistors R1~R7, a driving circuit 2121, and plural single-pole-single-throw (SPST) relays 2122~2128. The plural fixed resistors R1~R7 and the plural SPST relays 2122~2128 correspond to the plural electronic components T1~T7, respectively. The operations of the plural fixed resistors R1~R7 are identical to those of the fixed resistor R1 of the first embodiment, and the operations of the SPST relays 2122~2128 are identical to those of the SPST relay 1121 of the first embodiment. The driving circuit 2121 is connected with the data acquisition unit 213 and the plural SPST relays 2122~2128. In response to the operation of the data acquisition unit 213, one or more of the plural SPST relays 2122~2128 are selectively enabled by the driving circuit 2121. In this embodiment, the driving circuit 2121 is a driver IC. The driving circuit 2121 comprises plural input pins IN1~IN7 and plural output pins OUT1~OUT7. In response to the operation of the data acquisition unit 213, one of the plural SPST relays 2122~2128 is selectively enabled at each time.

The data acquisition unit 213 comprises plural digital output pins DO1~DO7, an analog output pin AO, and plural analog input pins AI1~AI7. The plural digital output pins DO1~DO7 correspond to the plural input pins IN1~IN7 of the driving circuit 2121, respectively. Moreover, the plural digital output pins DO1~DO7 are connected with the plural input pins IN1~IN7, respectively. The plural analog input pins AI1~AI7 correspond to the plural electronic components T1~T7 and the plural SPST relays 2122~2128, respectively. In addition, the plural analog input pins AI1~AI7 are connected with the plural electronic components T1~T7 and the plural SPST relays 2122~2128, respectively. The analog output pin AO is connected with the plural fixed resistors R1~R7. It is noted that the resistance values of the plural fixed resistors R1~R7 may be different or identical. According to the practical requirements, all of the resistance values of the plural fixed resistors R1~R7 are different. Alternatively, in some other embodiments, all of the resistance values of the plural fixed resistors R1~R7 are identical.

A method of using the circuit board testing system 2 to test the circuit board will be illustrated as follows. After the circuit board is properly placed on the testing fixture 21, the data acquisition unit 213 issues the start voltage Vh to the input pin IN1 of the driving circuit 2121 through the digital output pin DO1. Consequently, the output pin OUT1 of the driving circuit 2121 corresponding to the input pin IN1 outputs the start voltage Vh to the SPST relay 2122. Under this circumstance, the SPST relay 2122 is in a close state. On the other hand, the test voltage Vt is outputted from the data acquisition unit 213 through the analog output pin AO. Meanwhile, the electronic component T1 and the fixed resistor R1 are collaboratively defined as a first equivalent circuit. Consequently, the real voltage value VAI1 (not shown) corresponding to the electronic component T1 is acquired from the first equivalent circuit by the analog input pin AI1. After the real voltage value VAI1 is received by the computer host 121, the real resistance value corresponding to the electronic component T1 is calculated by the computer host 121 according to the real voltage value VAI1 and the above formula that is described in the first embodiment.

After the real resistance value is obtained by the computer host 121, the computer host 121 judges whether the real resistance value is within a first default resistance range Rp1 (not shown) or not. If the real resistance value is within the first default resistance range Rp1, the computer host 121 determines that the electronic component T1 is qualified to pass the static test. Under this circumstance, a pass test message (not shown) is displayed on the display screen 122. Whereas, if the real resistance value is not within the first default resistance range Rp1, the computer host 121 determines that the static test of the electronic component T1 is unqualified. Under this circumstance, a failed test message (not shown) is displayed on the display screen 122. Consequently, according to the test result shown on the display screen 122, the tester can realize whether the electronic component T1 passes the test. Meanwhile, the procedure of testing the electronic component T1 is completed.

After the static test of the electronic component T1 is completed, the static test of the electronic component T2 (not shown) is started by the testing fixture 21. Firstly, the digital output pin DO2 corresponding to the electronic component T2 is driven by the data acquisition unit 213. Consequently, the start voltage Vh is transmitted to the input pin IN2 of the driving circuit 2121 through the digital output pin DO2. Consequently, the output pin OUT2 of the driving circuit 2121 corresponding to the input pin IN2 outputs the start voltage Vh to the SPST relay 2123. Under this circumstance, the SPST relay 2123 is in a close state. On the other hand, the test voltage Vt is outputted from the data acquisition unit 213 through the analog output pin AO. Meanwhile, the electronic component T2 and the fixed resistor R2 are collaboratively defined as a second equivalent circuit (not shown). Consequently, the real voltage value corresponding to the electronic component T2 is acquired from the second equivalent circuit by the analog input pin AI2. After the real voltage value is received by the computer host 121, the real resistance value corresponding to the electronic component T2 is calculated by the computer host 121. Then, the subsequent judging action is performed.

The static tests of other electronic components T3~T7 are similar to the static test of the electronic component T1. That is, the data acquisition unit 213 sequentially issues the start voltage Vh through different digital output pins in order to implement the static tests of different electronic components. In this embodiment, the test results of the electronic components T1~T7 may be shown on the display screen 122. In case that any electronic component fails to pass the static test, the computer host 121 determines that the static test of the electronic component is unqualified. By viewing the test results of the electronic components T1~T7, the tester can realize which electronic component is damaged or improperly welded on the circuit board. It is noted that numerous modifications and alterations may be made while retaining the teachings of the invention. For example, in some other embodiments, if any electronic component fails to pass the static test, the computer host immediately stops the static tests of the remaining electronic components and determines that the circuit board fails to pass the static test.

As mentioned above, the analog output pin AO of the data acquisition unit 213 is connected with the plural fixed resistors R1~R7. In the above embodiment, the circuit board testing system 2 may test one electronic component at a time. That is, the test voltage Vt provided by the analog output pin AO at each time is sufficient to allow the electronic component and the corresponding fixed resistor to form the equivalent circuit. Consequently, the equivalent circuit can be normally operated, and the real voltage value corresponding to the electronic component can be acquired. Alternatively, in some other embodiments, the circuit board testing system may test two or three electronic components at a time. That is, the test voltage provided by the analog output pin at each time is sufficient to allow the two or three electronic components and the corresponding fixed resistors to form the equivalent circuits. That is, in response to the operation of the data acquisition unit, plural SPST relays may be selectively enabled by the driving circuit at each time. Consequently, the circuit board testing system is not restricted to test one electronic component at each time. For enhancing the testing efficiency, the circuit board testing system is capable of testing plural electronic components at each time.

Figure 6:
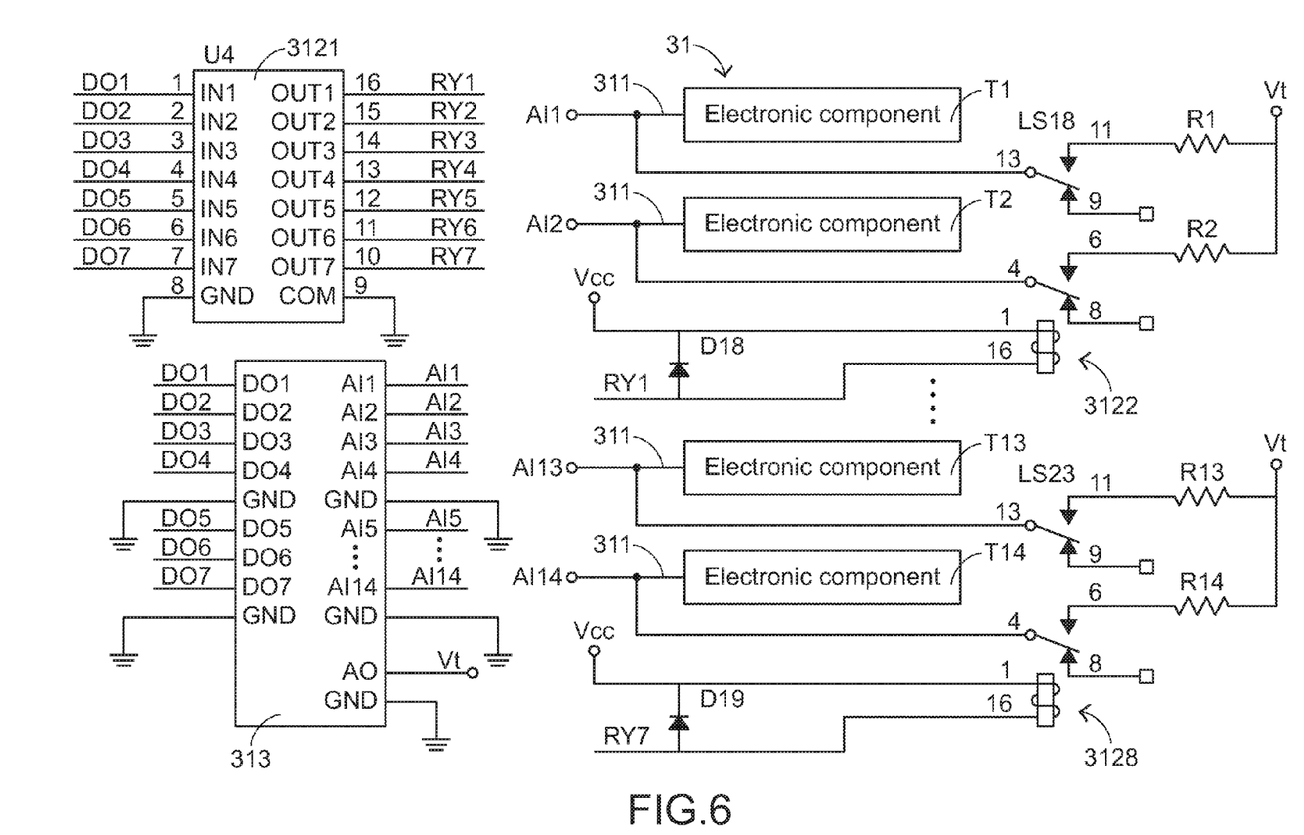
FIG. 6 is a schematic circuit diagram illustrating a circuit board testing system according to a third embodiment of the present invention.

The present invention further provides a circuit board testing system of a third embodiment in order to test a circuit board with plural electronic components. FIG. 6 is a schematic circuit diagram illustrating a circuit board testing system according to a third embodiment of the present invention. The circuit board testing system 3 may be applied to a static testing procedure of a circuit board (not shown) with plural electronic components T1~T14. The circuit board testing system 3 comprises a testing fixture 31 and a computer system 12 (see FIG. 2). The computer system 12 comprises a computer host 121 and a display screen 122. The functions and operations of the computer system 12 of this embodiment are identical to those of the first embodiment, and are not redundantly described herein. In comparison with the circuit board testing system 2 of the second embodiment, the inner structure of the testing fixture 31 of the circuit board testing system 3 of this embodiment is distinguished. The other components of the circuit board testing system 3 of this embodiment are substantially identical to those of the circuit board testing system 2 of the second embodiment, and are not redundantly described herein.

As shown in FIG. 6, the testing fixture 31 comprises plural contact elements 311, a switching circuit 312, and a data acquisition unit 313. The plural contact elements 311 are disposed on the testing fixture 31, and correspond to the plural electronic components T1~T14. The plural contact elements 311 are respectively contacted with the plural electronic components T1~T14 on the circuit board. Each of the plural contact elements 311 corresponds to one electronic component. That is, the testing fixture 31 of this embodiment comprises 14 contact elements 311. The switching circuit 312 is connected with the plural contact elements 311. The switching circuit 312 comprises plural fixed resistors R1~R14, a driving circuit 3121, and plural double-pole-double-throw (DPDT) relays 3122~3128. Every two fixed resistors correspond to one of the plural DPDT relays 3122~3128. Moreover, each of the plural DPDT relays 3122~3128 corresponds to one of the plural electronic components T1~T7. The driving circuit 3121 is connected with the data acquisition unit 313 and the plural DPDT relays 3122~3128. In response to the operation of the data acquisition unit 313, one of the plural DPDT relays 3122~3128 may be selectively enabled by the driving circuit 3121.

Each of the plural DPDT relays 3122~3128 comprises a first common terminal (i.e. the contact 13 as shown in FIG. 6), a second common terminal (i.e. the contact 4 as shown in FIG. 6), a first normally open terminal (i.e. the contact 9 as shown in FIG. 6), a second normally open terminal (i.e. the contact 8 as shown in FIG. 6), a first normally closed terminal (i.e. the contact 11 as shown in FIG. 6), and a second normally closed terminal (i.e. the contact 6 as shown in FIG. 6). The first normally closed terminal is connected with the fixed resistor R1. The second normally closed terminal is connected with the fixed resistor R2. In this embodiment, the driving circuit 3121 is a driver IC. The driving circuit 3121 comprises plural input pins IN1~IN7 and plural output pins OUT1~OUT7.

The data acquisition unit 313 comprises plural digital output pins DO1~DO7, an analog output pin AO, and plural analog input pins AI1~AI14. The plural digital output pins DO1~DO7 correspond to the plural input pins IN1~IN7 of the driving circuit 3121, respectively. Moreover, the plural digital output pins DO1~DO7 are connected with the plural input pins IN1~IN7, respectively. The plural analog input pins AI1~AI14 correspond to the plural electronic components T1~T14 and the plural DPDT relays 3122~3128, respectively. In addition, the plural analog input pins AI1~AI4 are connected with the plural electronic components T1~T14 and the plural DPDT relays 3122~3128, respectively. The analog output pin AO is connected with the plural fixed resistors R1~R14. In comparison with the second embodiment, the data acquisition unit 313 of the circuit board testing system 3 of this embodiment comprises more analog input pins (i.e. AI1~AI14). Consequently, the circuit board testing system 3 of this embodiment is capable of testing more electronic components.

A method of using the circuit board testing system 3 to test the circuit board will be illustrated as follows. After the circuit board is properly placed on the testing fixture 31, the electronic components T1 and T2 are tested at first. Firstly, the data acquisition unit 313 issues the start voltage Vh to the input pin IN1 of the driving circuit 3121 through the digital output pin DO1. Consequently, the output pin OUT1 of the driving circuit 3121 corresponding to the input pin IN1 outputs the start voltage Vh to the DPDT relay 3122. Under this circumstance, the connection between the first common terminal and the first normally open terminal of the DPDT relay 3122 is changed to the connection between the first common terminal and the first normally closed terminal of the DPDT relay 3122; and the connection between the second common terminal and the second normally open terminal of the DPDT relay 3122 is changed to the connection between the second common terminal and the second normally closed terminal of the DPDT relay 3122. That is, the DPDT relay 3122 is in a close state. On the other hand, the test voltage Vt is outputted from the data acquisition unit 313 through the analog output pin AO. Under this circumstance, the electronic component T1 and the fixed resistor R1 are collaboratively defined as a first equivalent circuit, and the electronic component T2 and the fixed resistor R2 are collaboratively defined as a second equivalent circuit.

Consequently, the real voltage value VAI1 (not shown) corresponding to the electronic component T1 is acquired from the first equivalent circuit by the analog input pin AI1 of the data acquisition unit 313. After the real voltage value VAI1 is received by the computer host 121, the real resistance value corresponding to the electronic component T1 is calculated by the computer host 121 according to the real voltage value VAI1 and the above formula. In addition, the real voltage value VAI2 (not shown) corresponding to the electronic component T2 is acquired from the second equivalent circuit by the analog input pin AI2 of the data acquisition unit 313. After the real voltage value VAI2 is received by the computer host 121, the real resistance value corresponding to the electronic component T2 is calculated by the computer host 121 according to the real voltage value VAI2 and the above formula. Then, the computer host 121 judges whether the real resistance value corresponding to the electronic component T1 is within a first default resistance range Rp1 (not shown) and judges whether the real resistance value corresponding to the electronic component T2 is within a second default resistance range Rp2 (not shown). According to the judging result, a pass test message or a failed test message is displayed on the display screen 122. Meanwhile, the static tests of the electronic components T1 and T2 are completed.

Then, the static tests of the electronic component T3 (not shown) and the electronic component T4 (not shown) are performed. The data acquisition unit 313 issues the start voltage Vh to the input pin IN2 of the driving circuit 3121 through the digital output pin DO2. Consequently, the output pin OUT2 of the driving circuit 3121 corresponding to the input pin IN2 outputs the start voltage Vh to the DPDT relay 3123. Under this circumstance, the DPDT relay 3123 is in a close state in order to form a third equivalent circuit (not shown) and a fourth equivalent circuit (not shown). Consequently, the real voltage value VAI3 (not shown) corresponding to the electronic component T3 is acquired by the analog input pin AI3 of the data acquisition unit 313, and the real voltage value VAI4 (not shown) corresponding to the electronic component T4 is acquired by the analog input pin AI4 of the data acquisition unit 313. Then, the real resistance value corresponding to the electronic component T3 and the real resistance value corresponding to the electronic component T4 are calculated by the computer host 121 according to the above formula. The subsequent process of judging the relationship between the real resistance value and the default resistance range is similar to above judging process, and is not redundantly described herein.

The static tests of the electronic components T5~T14 are similar to the static tests of the electronic components T1~T4. That is, the data acquisition unit 313 sequentially issues the start voltage Vh through different digital output pins in order to implement the static tests of different electronic components. In comparison with the second embodiment, the data acquisition unit 313 of the circuit board testing system 3 of this embodiment may drive two digit output pins at each time. Since the circuit board testing system is capable of testing two electronic components at each time, the efficiency of the static test is enhanced.

Figure 7:
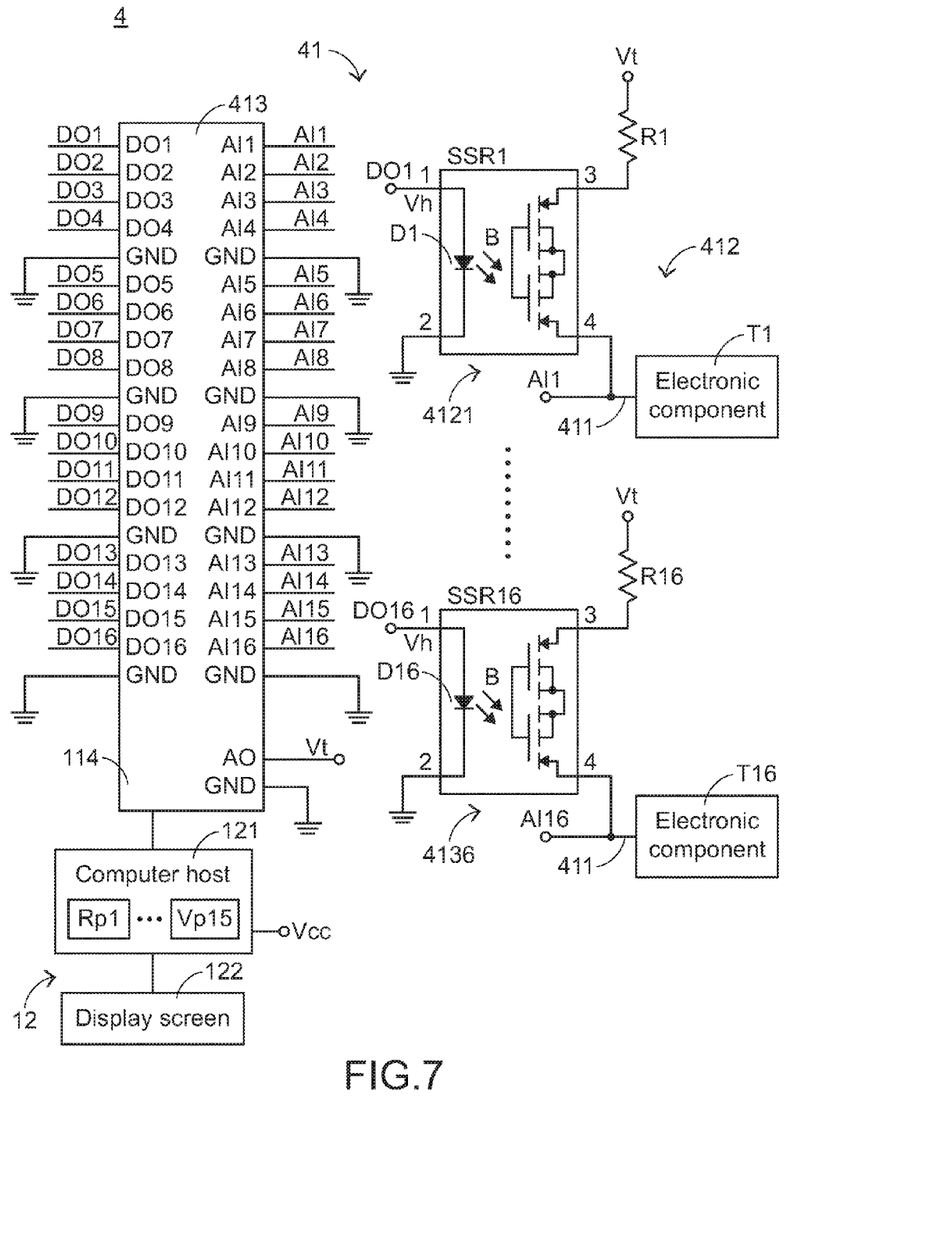
FIG. 7 is a schematic circuit diagram illustrating a circuit board testing system according to a fourth embodiment of the present invention.

The present invention further provides a fourth embodiment. FIG. 7 is a schematic circuit diagram illustrating a circuit board testing system according to a fourth embodiment of the present invention. The circuit board testing system 4 comprises a testing fixture 41 and a computer system 12. The computer system 12 comprises a computer host 121 and a display screen 122. The functions and operations of the computer system 12 of this embodiment are identical to those of the first embodiment, and are not redundantly described herein. The testing fixture 41 comprises plural contact elements 411, a switching circuit 412, and a data acquisition unit 413. The plural contact elements 411 are disposed on the testing fixture 41, and correspond to the plural electronic components T1~T16 on a circuit board (not shown). The plural contact elements 411 are respectively contacted with the plural electronic components T1~T16 on the circuit board. Each of the plural contact elements 411 corresponds to one electronic component. That is, the testing fixture 41 of this embodiment comprises 16 contact elements 411.

As shown in FIG. 7, the switching circuit 412 is connected with the plural contact elements 411. The switching circuit 412 comprises plural fixed resistors R1~R16, and plural optical relays 4121~4136. The fixed resistor R1 corresponds to the electronic component T1. The fixed resistor R2 corresponds to the electronic component T2. The fixed resistor R16 corresponds to the electronic component T16. The rest may be deduced by analogy. The plural optical relays 4121~4136 are connected with the data acquisition unit 413 and the plural optical relays 4121~4136. In response to the start voltage Vh, the plural electronic components T1~T16 and the plural fixed resistors R1~R16 are collaboratively defined as plural equivalent circuits. For example, the optical relay 4121 comprises a light emitter D1 and a metal-oxide-semiconductor field-effect transistor F1. A first input terminal of the light emitter D1 (i.e. the contact 1 as shown in FIG. 7) is connected with a digital output pin DO1 of the data acquisition unit 413. A second input terminal of the light emitter D1 (i.e. the contact 2 as shown in FIG. 7) is connected with a ground terminal. In response to the start voltage Vh, the light emitter D1 emits a light beam B. A first output terminal of the metal-oxide-semiconductor field-effect transistor F1 (i.e. the contact 3 as shown in FIG. 7) is connected with the fixed resistor R1. A second output terminal of the metal-oxide-semiconductor field-effect transistor F1 (i.e. the contact 4 as shown in FIG. 7) is connected with an analog input pin AI1 of the data acquisition unit 413 and the electronic component T1. When the light beam B is received by the metal-oxide-semiconductor field-effect transistor F1, the metal-oxide-semiconductor field-effect transistor F1 is closed, and thus the optical relay 4121 is enabled. When the optical relay 4121 is enabled, the electronic component T1 and the fixed resistor R1 are collaboratively defined as a first equivalent circuit. The functions of the optical relays 4122~4136 are similar to those of the optical relay 4121, and are not redundantly described herein. In this embodiment, the optical relays 4122~4136 are single-pole-single-throw (SPST) normally-open optical relays.

Similarly, after plural equivalent circuits are formed, the real voltage values VAI1~VAI16 (not shown) corresponding to the electronic components T1~T16 are respectively acquired from the equivalent circuits by the analog input pins AI1~AI16 of the data acquisition unit 413. After the real voltage values VAI1~VAI16 are received by the computer host 121, the real resistance values corresponding to the electronic components T1~T16 are calculated by the computer host 121 according to the above formula that is described in the first embodiment. Then, the computer host 121 judges whether the real resistance value corresponding to the electronic component T1 is within a first default resistance range Rp1; the computer host 121 judges whether the real resistance value corresponding to the electronic component T2 is within a second default resistance range Rp2; the computer host 121 judges whether the real resistance value corresponding to the electronic component T16 is within a second default resistance range Rp16 (not shown), and the rest may be deduced by analogy. According to the judging result, a pass test message or a failed test message is displayed on the display screen 122. Meanwhile, the static tests of the electronic components T1~T16 are completed.

In the circuit board testing system 4 of this embodiment, the plural optical relays 4121~4136 of the switching circuit 412 are used to replace the conventional single-pole-single-throw (SPST) relays and the conventional double-pole-double-throw (DPDT) relays. In comparison with the conventional SPST relays and the conventional DPDT relays, the optical relays 4121~4136 can reduce the loss current and largely reduce the excitation loss. Moreover, since a low voltage is sufficient to drive the light emitter D1 of the optical relay 4121, it is not necessary to install the switching circuit 412. Consequently, the cost of the components will be reduced.

In the above embodiments, the numbers of pins of the data acquisition unit and the driving circuit of the circuit board testing system of the present invention are limited. For expanding the numbers of pins of the data acquisition unit and the driving circuit, the data acquisition unit and the driving circuit may be additionally equipped with multiplexers. Consequently, the data acquisition unit and the driving circuit may be connected to more SPST relays or more DPDT relays in order to test more electronic components.

Since the tester can test more electronic components in a test cycle of a circuit board, the efficiency of the static test is enhanced.

From the above descriptions, the present invention provides a circuit board testing system. In the circuit board testing system, a data acquisition unit and a switching circuit are disposed on a testing fixture. Consequently, the electronic component to be tested and the corresponding fixed resistor are collaboratively defined as an equivalent circuit, and a real voltage value corresponding to the electronic component is acquired from the equivalent circuit. Then, a real resistance value corresponding to the electronic component is calculated by the computer system according to the real voltage value and a specified formula. Then, the computer system judges whether the real resistance value is within a default resistance range, thereby judging whether the electronic component passes the static test. In comparison with the conventional manual testing method of repeatedly using a contact probe of an electricity meter to manually and sequentially contact each electronic component to be tested, the circuit board testing system of the present invention can save labor and time and achieve better testing efficiency. Moreover, the testing efficacy of the circuit board testing system of the present invention is similar to that of the conventional LCR meter. However, in comparison with the conventional LCR meter, the circuit board testing system of the present invention is more cost-effective and has cost advantage.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:
1. A circuit board testing system, comprising:
a testing fixture, wherein the testing fixture comprises:
a plurality of contact elements, each being provided for electric connection to one electronic component to be tested;
a switching circuit connected with each of the contact elements, and turned on in response to a start voltage, wherein the switching circuit comprises:
a first fixed resistor corresponding to a first electronic component to be tested;
a second fixed resistor corresponding to a second electronic component to be tested;
a double-pole-double-throw relay, wherein a first normally closed terminal of the double pole-double-throw relay is connected with the first fixed resistor, and a second normally closed terminal of the double-pole-double-throw relay is connected with the second fixed resistor; and
a driving circuit connected with the double-pole-double-throw relay, wherein the double-pole-double-throw relay is enabled by the driving circuit in response to the start voltage, wherein when the double-pole-double-throw relay is enabled, the first electronic component and the first fixed resistor are collaboratively defined as a first equivalent circuit, and the second electronic component and the second fixed resistor are collaboratively defined as a second equivalent circuit; and a data acquisition unit electrically connected with driving circuit of the switching circuit for providing the start voltage to turn on the switch circuit and providing a test voltage to each of the electronic components electrically connected to the contact elements via the turned-on switching circuit, thereby acquiring a real voltage value of each of the electronic components, wherein the data acquisition unit comprises a digital output pin for outputting the start voltage, an analog output pin for outputting the test voltage, and an analog input pin for acquiring the real voltage value of the electronic component, wherein the digital output pin of the data acquisition unit is connected with the driving circuit and outputs the start voltage to the driving circuit, so that the double-pole-double-throw relay is in a close state, wherein the analog output pin of the data acquisition unit is connected with the first fixed resistor and the second fixed resistor, the first electronic component and the first fixed resistor are collaboratively defined as the first equivalent circuit, and the second electronic component and the second fixed resistor are collaboratively defined as the second equivalent circuit, so that the analog input pin of the data acquisition unit acquires a first real voltage value from the first equivalent circuit and acquires a second real voltage value from the second equivalent circuit; and a computer system electrically connected with the testing fixture for converting the real voltage value into a real impedance value corresponding to the electronic component, wherein the computer system comprises:

a computer host connected with the data acquisition unit, wherein a first default impedance range and a second default impedance range are previously stored in the computer host, wherein according to the first and second default impedance range, the computer host judges whether the first and second electronic elements are qualified or not; and a display screen connected with the computer host and showing a test result of the circuit board, wherein after the first real voltage value and the second real voltage value are received by the computer host, the computer host judges whether the first real voltage value and the second real voltage value are within the default impedance range or not, wherein if the first real voltage value is not within the first default impedance range, the computer host determines that the first electronic component is unqualified, and if the second real voltage value is not within the second default impedance range, the computer host determines that the second electronic component is unqualified.

2. The circuit board testing system according to claim 1, wherein when the start voltage is not outputted from the digital output pin of the data acquisition unit to the driving circuit, a first common terminal of the double-pole-double-throw relay is contacted with a first normally open terminal of the double-pole-double-throw relay, and a second common terminal of the double-pole-double-throw relay is contacted with a second normally open terminal of the double-pole-double-throw relay, wherein when the start voltage is outputted from the digital output pin of the data acquisition unit to the driving circuit, the first common terminal of the double-pole-double-throw relay is contacted with the first normally closed terminal of the double-pole-double-throw relay, and the second common terminal of the double-pole-double-throw relay is contacted with the second normally closed terminal of the double-pole-double-throw relay, so that the double-pole-double-throw relay is in the close state and the first equivalent circuit and the second equivalent circuit are formed.

3. The circuit board testing system according to claim 1, wherein a computer host of the computer system is connected with the data acquisition unit through a USB interface, wherein the driving circuit is a Darlington circuit or a driver IC, the contact element is a contact probe, and the start voltage is a high logic level voltage.

* * * * *